United States Patent
Vadakital et al.

(10) Patent No.: US 7,843,947 B2
(45) Date of Patent: Nov. 30, 2010

(54) SYSTEM AND METHOD FOR PROVIDING UNEQUAL ERROR PROTECTION TO PRIORITY LABELED DATAGRAMS IN A DVB-H TRANSMISSION SYSTEM

(75) Inventors: Vinod Kumar Malamal Vadakital, Tampere (FI); Miska Hannuksela, Ruutana (FI); Harri Pekonen, Raisio (FI); Jussi Vesma, Turku (FI)

(73) Assignee: Nokia Corporation, Espoo (FI)

( * ) Notice: Subject to any disclaimer, the term of this patent is extended or adjusted under 35 U.S.C. 154(b) by 539 days.

(21) Appl. No.: 11/436,339

(22) Filed: May 18, 2006

(65) Prior Publication Data

US 2006/0262810 A1    Nov. 23, 2006

Related U.S. Application Data

(60) Provisional application No. 60/682,626, filed on May 19, 2005.

(51) Int. Cl.
| G01R 31/08 | (2006.01) |
| H04L 12/28 | (2006.01) |
| H04J 3/02 | (2006.01) |
| H04N 7/173 | (2006.01) |
| G06F 11/00 | (2006.01) |
| H03M 13/00 | (2006.01) |

(52) U.S. Cl. .............. 370/395.64; 370/236.2; 370/395.21; 370/431; 370/462; 725/105; 714/704; 714/784

(58) Field of Classification Search .............. 370/236.2, 370/395.21, 370.431, 370.462; 725/105, 725/704

See application file for complete search history.

(56) References Cited

U.S. PATENT DOCUMENTS

| 6,430,159 | B1 | 8/2002 | Wan et al. ................ 370/246 |
| 7,123,669 | B2* | 10/2006 | Ye et al. ................. 375/341 |
| 2003/0156645 | A1* | 8/2003 | Cohen ................ 375/240.16 |
| 2003/0206521 | A1* | 11/2003 | Qiao ..................... 370/230 |
| 2005/0015704 | A1* | 1/2005 | Piret et al. .............. 714/781 |
| 2006/0084435 | A1* | 4/2006 | Borsos et al. ............ 455/436 |
| 2006/0128427 | A1* | 6/2006 | van Rooyen ............ 455/553.1 |

FOREIGN PATENT DOCUMENTS

WO    WO 2004/080067    9/2004

OTHER PUBLICATIONS

Ihidoussene et al., An unequal error protection using Reed-Solomon codes for real-time MPEG video stream. IEEE, p. 254-258, 2002.*

(Continued)

*Primary Examiner*—Daniel J Ryman
*Assistant Examiner*—Thinh D Tran
(74) *Attorney, Agent, or Firm*—AlbertDhand LLP

(57) ABSTRACT

An improved system and method for transmitting a multiplexed service stream over an error prone DVB-H channel. Media IP packets are priority labeled. For each time slice burst, the IP packets are grouped based upon the priority labels. MPE-FEC matrices are made for the different priority labels in each time slice burst. RSDT columns are computed such that the average service bit rate does not overshoot the maximum allowed service bit rate, and the protection increases with priority. The ADT and RSDT of the MPE-FEC matrices are then encapsulated into MPE-FEC sections.

21 Claims, 7 Drawing Sheets

OTHER PUBLICATIONS

Final draft ETSI EN 302 304 v1.1.1 (Jun. 2004), European Standard (Telecommunication series), Digital video broadcasting (DVB); Transmission System for handheld terminals (DVB-H), p. 1-14, 2004.*

Final draft ETSI EN 301 192 v1.4.1 (Jun. 2004), European Standard (Telecommunication series), Digital video broadcasting (DVB); DVB specification for data broadcasting, p. 1-78, 2004.*

International Search Report for PCT Application PCT/IB2006/001311.

* cited by examiner

US 7,843,947 B2

SYSTEM AND METHOD FOR PROVIDING UNEQUAL ERROR PROTECTION TO PRIORITY LABELED DATAGRAMS IN A DVB-H TRANSMISSION SYSTEM

FIELD OF THE INVENTION

The present invention relates to the transmission of a media stream over an error prone Digital Video Broadcasting for Handhelds (DVB-H) channel, wherein the media datagrams are priority-labeled, multi-protocol encapsulation section packed, unequally protected using forward error correction codes, transport stream packetized, and transmitted into the channel using time-sliced bursts.

BACKGROUND OF THE INVENTION

The Digital Video Broadcasting (DVB) organization has specified protocols relating to the broadcasting of multiplexed data. This broadcast of data is referred to as datacasting. Based on the requirements of different applications using datacasting, six different profiles have been specified. These profiles are data piping, data streaming, multi-protocol encapsulation, data carousels, object carousels and higher protocols based on asynchronous data streams.

The ever growing demand for IP based services has recently resulted in the requirement of an intermediate layer for handling the incompatibilities between the Internet's IP architecture and DVB's broadcasting protocol architecture. This layer was included as one of the profiles in the datacasting specifications as the Multi-protocol encapsulation profile. In this profile, OSI layer 3 datagrams were encapsulated into multi-protocol encapsulated (MPE) sections according to DVB's private data Digital Storage Media—Command and Control (DSM-CC) specifications. The MPE sections are then mapped onto a stream of 188 byte MPEG-2 system layer transport stream (TS) packets.

DVB's physical layer protocol differs based upon the physical channel upon which the services are transported. Consequently, different protocols for satellite (DVB-S), cable (DVB-C) and terrestrial (DVB-T) communication have been specified. DVB-T, which was primarily developed for fixed reception with roof-top directive antennae, was found to be efficient for mobile data services, but not suitable for small handheld, low powered battery operated terminals. Handheld mobile terminals require specific features from the transmission system serving them. These features include extended receiver battery life, improved RF performance for mobile single antenna reception, the ability to counter high levels of noise in a hostile transmission environment, and the ability to effectuate an efficient handover.

DVB-H-enhanced DVB-T specifications incorporate the above-identified features by including an optional Reed Solomon forward error correction (RS-FEC) computed across MPE section payloads, referred to herein as MPE-FEC, as well as time slicing of the MPE and/or MPE-FEC sections.

A simplified block diagram of an IP data casting (IPDC) system over DVB-H is depicted in FIG. 10. Content servers typically comprise normal IP multicast servers using real-time media transport over RTP. The IP network is typically a fixed-line private network. The IP encapsulator packetizes IP packets into MPEG-2 transport stream packets and transmits them over the DVB-H network to receiving terminals.

The process of receiving, demodulating and decoding of a full bandwidth DVB-T signal requires substantial power. However, small, handheld, battery-operated devices usually do not have such power at their disposal. To reduce the power consumption in handheld terminals, the service data is time-sliced before it is sent into the channel. When time-slicing is used, the data of a time-sliced service is sent into the channel in bursts so that the receiver, using the control signals, can remain inactive when no bursts are to be received. This reduces the power consumption in the receiving terminal. The bursts are sent at a significantly higher bit rate than the media decoding bit rate of coded data in any burst, and the inter-time-slice period is computed such that the average bit rate across all time-sliced bursts of the same service is the same as when conventional bit rate management is used. FIG. 1 shows the relationship between the burst time, the burst interval, the service bandwidth (the average constant bandwidth for the service that is time-sliced) and the burst bandwidth. For downward compatibility between DVB-H and DVB-T, the time-sliced bursts can be transmitted along with non-time-sliced services.

Time-slicing in DVB-H uses a delta-t method to signal the start of the next burst. The timing information that is delivered using the delta-t method is relative and is the difference between the current time and the start of the next burst. The use of the delta-t method for signaling removes the need for synchronization between the transmitter and receiver. The use of this method also provides increased flexibility because parameters such as burst size, burst duration, burst bandwidth and off-times can be freely varied between elementary streams, as well as between bursts within an elementary stream.

MPE-FEC is an optional OSI layer-3 FEC code based on RS codes. MPE-FEC is included in the DVB-H specifications in order to counter high levels of transmission errors. MPE-FEC packs the RS data into a special FEC section so that an MPE-FEC-ignorant receiver can simply ignore any MPE-FEC sections.

An MPE-FEC frame is arranged as a matrix with 255 columns and a flexible number of rows. Each position in the matrix hosts an information byte. The first 191 columns are dedicated to OSI layer 3 datagrams, referred to herein as "datagrams", and possible padding. This portion of the MPE-FEC frame is referred to as the application data table (ADT). The ADT can be completely or partially filled with datagrams.

The next 64 columns of the MPE-FEC frame are reserved for RS parity information. These columns are referred to as the RS data table (RSDT). The remaining columns, when the ADT is partially filled, are padded with zero bytes and are referred to as padding columns. Padding is also performed when there is no more space left in the MPE-FEC frame to fill the next complete datagram. The RSDT is computed across each row of the ADT using RS (255, 191). It is not necessary to compute the entire 64 columns of the RSDT. Some of the RSDT's right-most columns can be completely discarded, which is referred to as puncturing. The padded and punctured columns are not sent over the transmission channel. The process for computing a RSDT according to conventional systems is depicted in FIG. 3.

Media information can be classified into priorities based upon the importance of the media information and the perception of the information by the user. The importance of the media information can be either manually certified by a person in the relevant field or automatically certified by using a-priori knowledge of the coded media information. For example, from a user perception point of view, it can be assumed in most practice cases that audio information is more important than video information when there is an audio-visual multiplexed stream. Additionally, in hybrid video coders, referenced Intra frames and Inter predicted frames are more important than unreferenced Inter predicted frames due to the error propagation that occurs when referenced frames are lost. Many video coding standards also provide mechanisms for scalable coding, in which the coded bit stream contains hierarchical layers of enhancement information. Additional information on scalable coding in the H.264/AVC is provided below. Furthermore and in some audio coding schemes which use code-book information for decoding, the code-book information is more important than the audio stream that uses the code-book. In yet another example, instrument definitions have a higher importance than the actual MIDI stream when using MIDI. Lastly, subtitling and auxiliary relevant information, such as Supplemental Enhancement Information (SEI) of H.264/AVC video in a particular service, can be assumed to be of less importance than the actual audio-visual data in certain situations. For these reasons, media IP packets, also referred to simply as IP packets, that are transmitted on the DVB-H channel can be priority labeled in most circumstances.

H.264/AVC allows the use of multiple reference pictures for motion compensation, i.e., there is a reference picture buffer containing multiple decoded pictures from which an encoder can select a reference picture for inter prediction on a block basis. In addition to reference pictures, which are stored to the reference picture buffer, the H.264/AVC standard features non-reference pictures, which cannot be used as a prediction source for inter prediction. In contrast to earlier standards in which "disposable" pictures were always B pictures, non-reference pictures in H.264/AVC can be of any coding type. Decoupling of decoding and output order of pictures not only enables conventional B-picture-like temporal scalability in H.264/AVC, but also facilitates a hierarchical temporal scalability scheme which is referred to as sub-sequences. Sub-sequences are used to construct a layered bit stream in which each enhancement layer contains sub-sequences, and each sub-sequence contains a number of reference and/or non-reference pictures. A sub-sequence consists of a number of inter-dependent pictures that can be disposed without any disturbance to any other sub-sequence in any lower sub-sequence layer. Sub-sequence layers are hierarchically arranged based upon their dependency on each other. When a sub-sequence in the highest enhancement layer is disposed, the remaining bit stream remains valid.

When time-slicing is in use, the time-slice start and stop times are computed using the delta-t and the maximum_burst_duration fields in the headers of the time-sliced MPE sections. A time-sliced burst cannot start before the end of delta-t time signalled by the MPE section headers of the previous time-sliced burst, and a time-sliced burst cannot end later than the time indicated by delta-t+maximum_burst_duration.

The layer 3 datagrams are always carried in MPE sections, regardless of whether MPE-FEC is used, thus enabling it to be fully backward compatible to MPE-FEC-ignorant receivers. The last section in an ADT table contains a table_boundary flag that signals the end of layer 3 datagrams within the ADT. In a time-sliced scenario, an MPE-FEC-aware receiver, upon encountering a table_boundary_flag, determines if all ADT sections are received correctly, and discards all remaining sections in the burst if all ADT sections are received correctly. If some of the ADT section contain errors, then the RSDT sections are received and used to try and correct the errors. An MPE-FEC-ignorant receiver simply ignores the MPE-FEC (the RSDT portion of an MPE-FEC matrix) section packets and switches off the receiver until the next burst.

SUMMARY OF THE INVENTION

The present invention provides a system and method for unequally protecting service datagrams, based on priorities, such that data that is considered to be more important is protected to a better extent than subjectively less important data. The present invention can result in a minimized startup delay when receiving a prioritized service bit stream that is unequally protected. The present invention also permits terminals of different capabilities to receive only the portion of the coded bit stream that they are capable of decoding. This requires a lower duration DVB-H reception than conventional systems and also significantly reduces the power consumption of the device at issue when compared to conventional systems.

With the present invention, unequal error protection can be applied differently to subjectively different important parts of service datagrams. Expected tune-in delays are decreased if the values of the delta-t, max_burst_duration and the burst bit rates are computed appropriately. Lastly, the present invention a receivers of varying capabilities with a mechanism for receiving and decoding only the relevant information for its capability level.

These and other objects, advantages and features of the invention, together with the organization and manner of operation thereof, will become apparent from the following detailed description when taken in conjunction with the accompanying drawings, wherein like elements have like numerals throughout the several drawings described below.

DETAILED DESCRIPTION OF THE PREFERRED EMBODIMENTS

Figure 7:
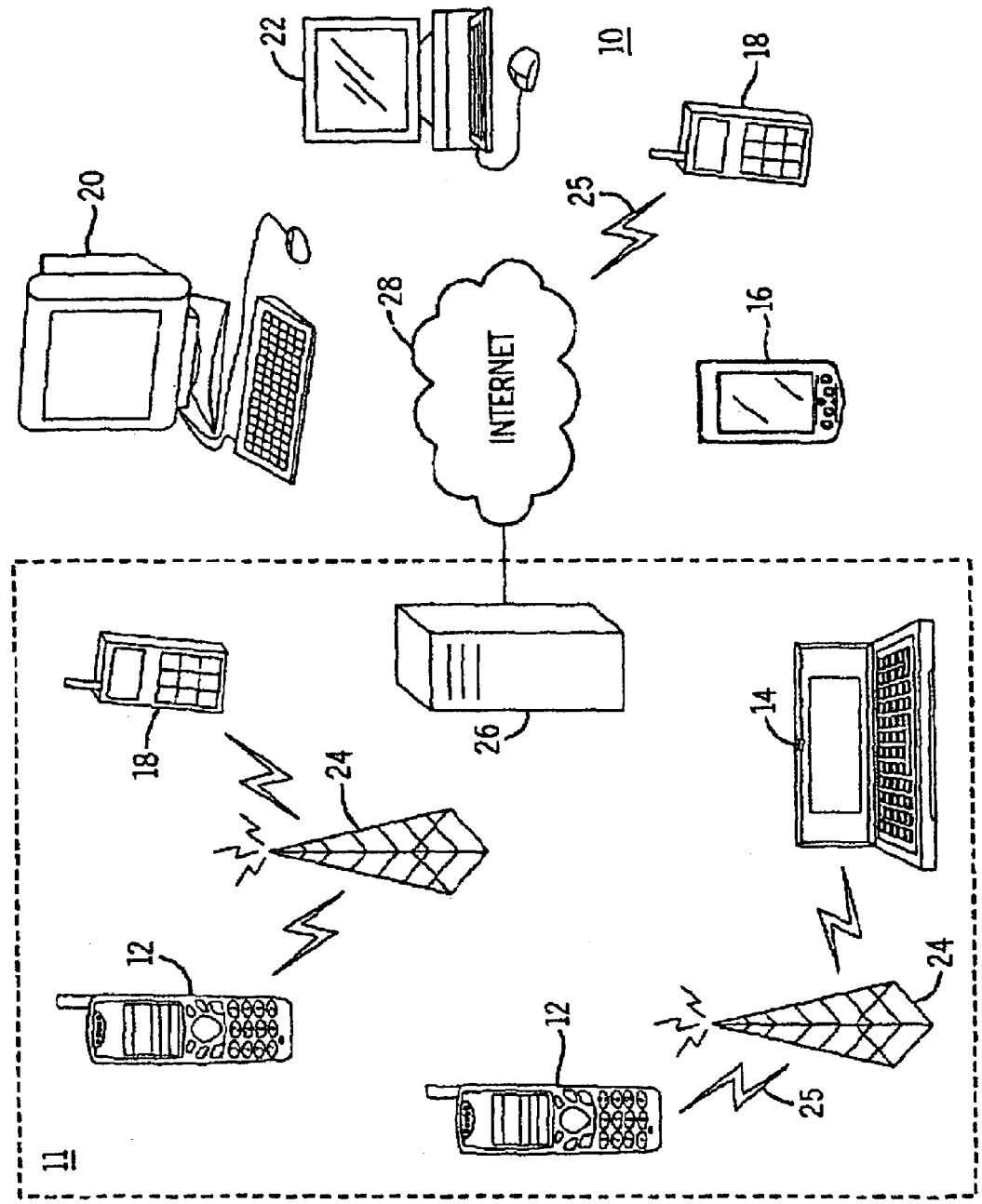
FIG. 7 is an overview diagram of a system according to an embodiment of the present invention.

FIG. 7 shows a system 10 in which the present invention can be utilized, comprising multiple communication devices that can communicate through a network. The system 10 may comprise any combination of wired or wireless networks including, but not limited to, a mobile telephone network, a wireless Local Area Network (LAN), a Bluetooth personal area network, an Ethernet LAN, a token ring LAN, a wide area network, the Internet, etc. The system 10 may include both wired and wireless communication devices.

For exemplification, the system 10 shown in FIG. 7 includes a mobile telephone network 11 and the Internet 28. Connectivity to the Internet 28 may include, but is not limited to, long range wireless connections, short range wireless connections, and various wired connections including, but not limited to, telephone lines, cable lines, power lines, and the like.

The exemplary communication devices of the system 10 may include, but are not limited to, a mobile telephone 12, a combination PDA and mobile telephone 14, a PDA 16, an integrated messaging device (IMD) 18, a desktop computer 20, and a notebook computer 22. The communication devices may be stationary or mobile as when carried by an individual who is moving. The communication devices may also be located in a mode of transportation including, but not limited to, an automobile, a truck, a taxi, a bus, a boat, an airplane, a bicycle, a motorcycle, etc. Some or all of the communication devices may send and receive calls and messages and communicate with service providers through a wireless connection 25 to a base station 24. The base station 24 may be connected to a network server 26 that allows communication between the mobile telephone network 11 and the Internet 28. The system 10 may include additional communication devices and communication devices of different types.

The communication devices may communicate using various transmission technologies including, but not limited to, Code Division Multiple Access (CDMA), Global System for Mobile Communications (GSM), Universal Mobile Telecommunications System (UMTS), Time Division Multiple Access (TDMA), Frequency Division Multiple Access (FDMA), Transmission Control Protocol/Internet Protocol (TCP/IP), Short Messaging Service (SMS), Multimedia Messaging Service (MMS), e-mail, Instant Messaging Service (IMS), Bluetooth, IEEE 802.11, etc. A communication device may communicate using various media including, but not limited to, radio, infrared, laser, cable connection, and the like.

Figure 8:
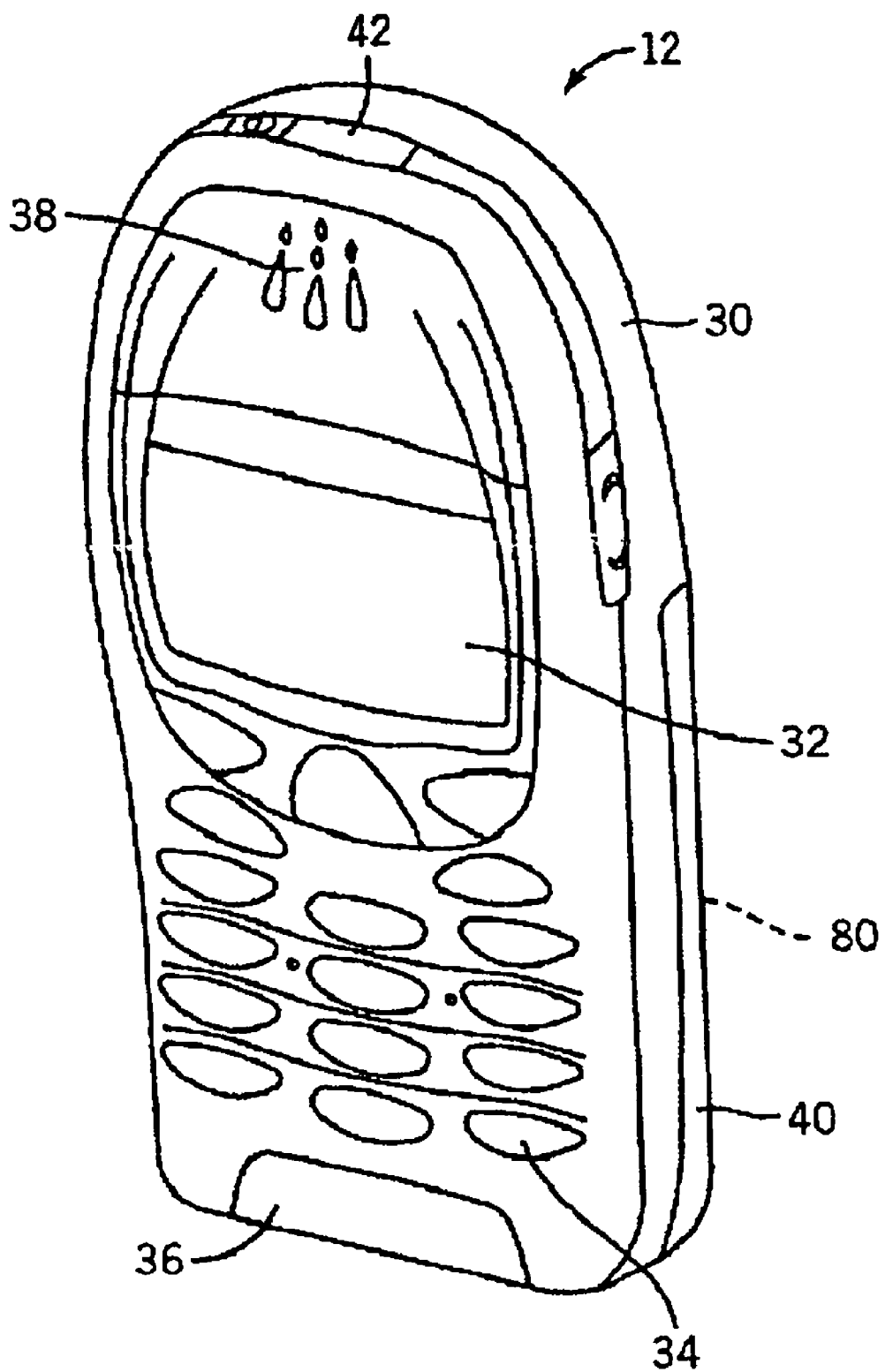
FIG. 8 is a perspective view of a mobile telephone that can be used in the implementation of the present invention.
Figure 9:
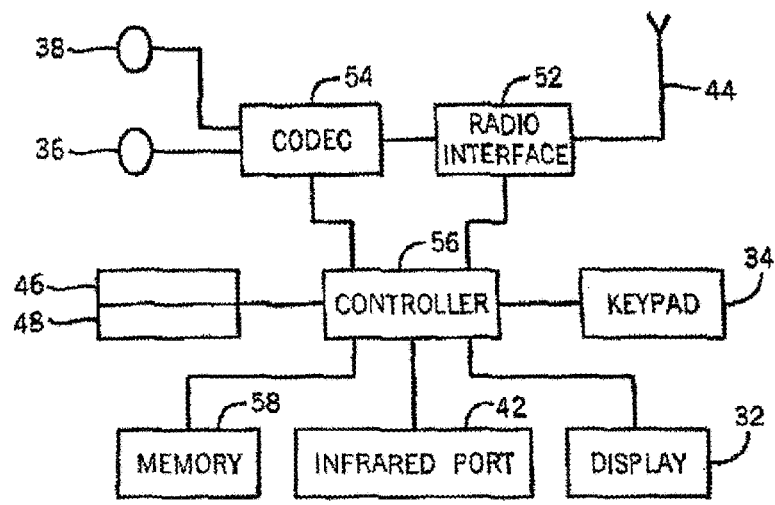
FIG. 9 is a schematic representation of the telephone circuitry of the mobile telephone of FIG. 8.
Figure 10:
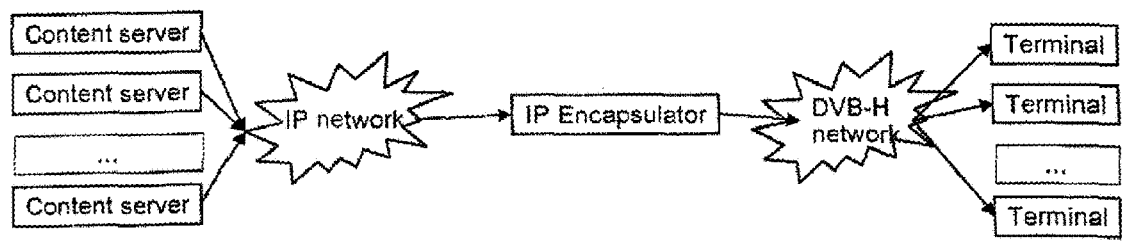
FIG. 10 is a simplified block diagram showing an IP data casting system over DVB-H.

FIGS. 8 and 9 show one representative mobile telephone 12 according to one embodiment of the invention. It should be understood, however, that the present invention is not intended to be limited to one particular type of mobile telephone 12 or other electronic device. The mobile telephone 12 of FIGS. 8 and 9 includes a housing 30, a display 32 in the form of a liquid crystal display, a keypad 34, a microphone 36, an ear-piece 38, a battery 40, an infrared port 42, an antenna 44, a smart card 46 in the form of a UICC according to one embodiment of the invention, a card reader 48, radio interface circuitry 52, codec circuitry 54, a controller 56 and a memory 58. Individual circuits and elements are all of a type well known in the art, for example in the Nokia range of mobile telephones.

The present invention comprises a system and method for providing unequal error protection to priority-labeled datagrams. The present invention can be used for virtually any type of service that uses the DVB-H transmission system. According to the present invention, "service" is defined by the multiplex of datagrams that are of relevance to a receiving terminal. The present invention also enables terminals of varying capabilities (specified as IRD levels) to receive and decode only the relevant data that is required for normal operation, thus resulting in reduced power consumption for the receiving terminal and without having any effect on the tuning in delay.

The present invention is built upon the concept that the datagrams are priority labeled based upon their respective importance. This priority labeling can occur either manually or automatically using a-priori knowledge. For example, in a news broadcasting service, audio has a higher priority than video, which in turn has a higher priority than auxiliary media enhancement data. In this particular example, priority levels can be further assigned within the video bit stream so that referenced frame datagrams, such as Intra frame datagrams and referenced Inter frame datagrams, can be assigned higher priority than non-referenced Intra frame datagrams. This priority labeling procedure can either be performed at the MPE encapsulator, also referred to as the IP encapsulator, or external to the MPE encapsulator. In either event, however, the MPE encapsulator should know the priority of the incoming datagrams. Datagrams that are not priority labeled can be sorted out and given a relevant priority which is different from the priority level of the other, priority labeled datagrams. Using this system, all datagrams of a service will have some priority label associated with them. In an extreme situation, when all datagrams are not priority labeled, there can be an assignment of one priority label to all of the datagrams.

In a practical implementation of signaling the priority according to one embodiment of the present invention, IP multicasting is used, and a separate multicast group address is assigned for each priority level. Alternatively, the priority bits in the IPv6 packet header are used. Media-specific indications of priority indicated in the RTP payload headers or RTP payloads can also be used. For example, the nal_ref_idc element in the RTP payload header of the H.264 RTP payload format can include this information.

According to the principles of the present invention, the media samples corresponding to a certain duration, either in terms of decoding or output timestamps, are encapsulated to more than one MPE-FEC matrix according to their priority label. These MPE-FEC matrices are referred to herein as peer MPE-FEC matrices. The peer MPE-FEC matrices also have a priority order among themselves, i.e. the highest priority MPE-FEC matrix should always be received, while the other peer MPE-FEC matrices improve the subjective quality in their order of priority.

Figure 1:
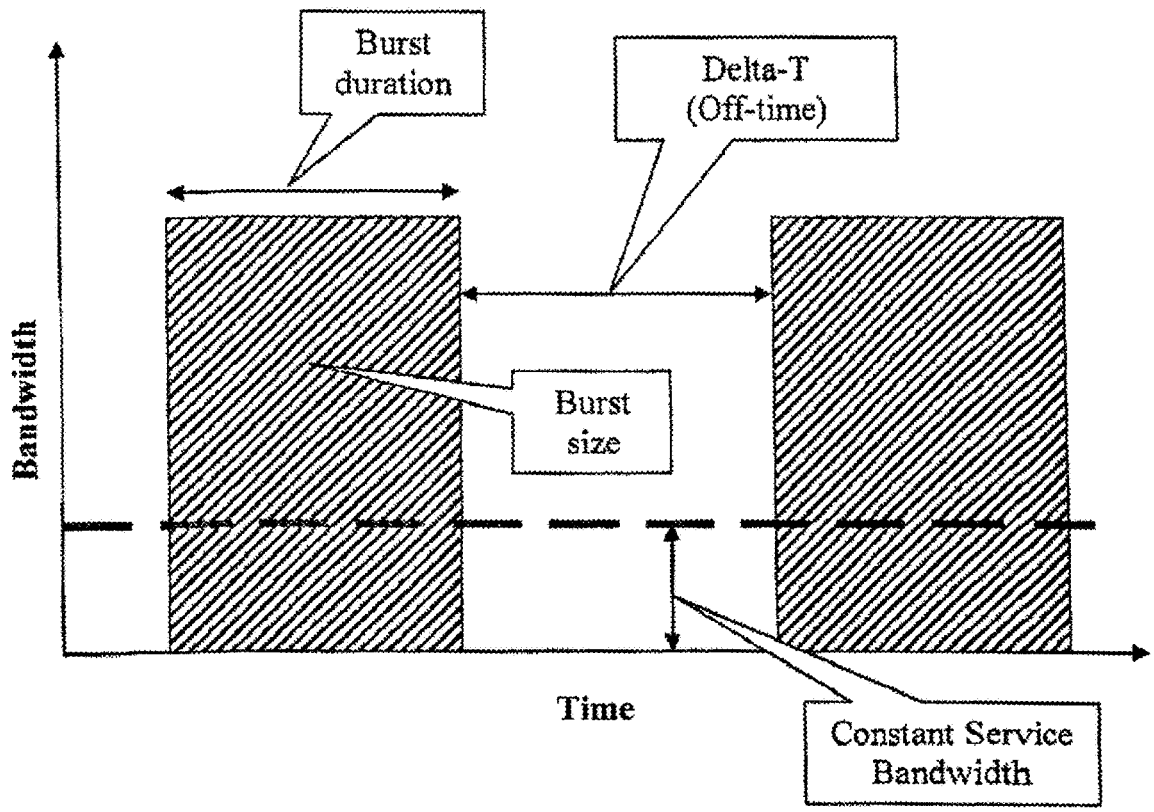
FIG. 1 is a representation of time-slicing bursts of a single service and the relationship between the burst size, burst time, burst bandwidth, service bandwidth, and off-times.
Figure 2:
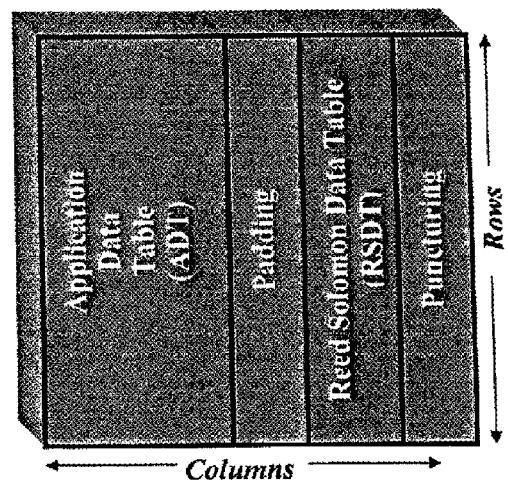
FIG. 2 is a representation showing the structure of a MPE-FEC matrix.
Figure 3:
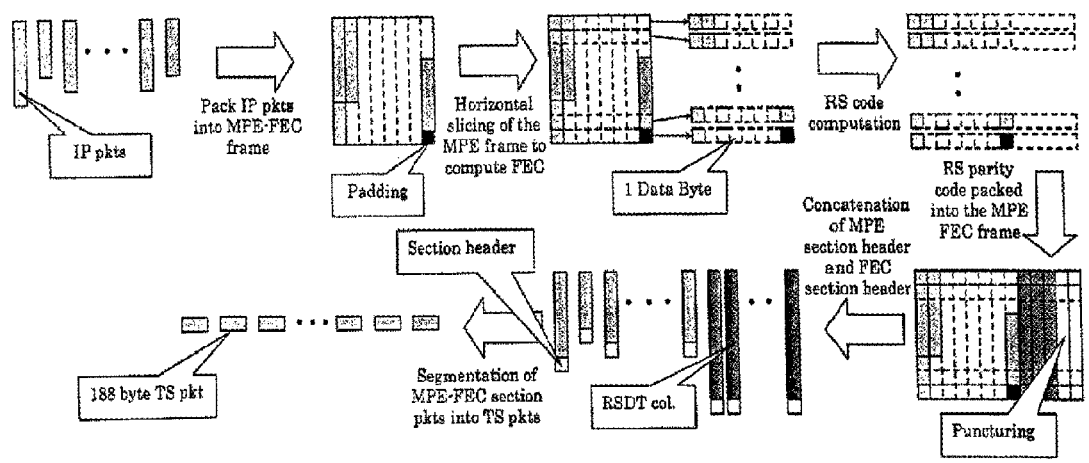
FIG. 3 is a representation showing the computation of RSDT for MPE-FEC in accordance with conventional systems.

According to one embodiment of the present invention, the peer MPE-FEC matrices are transmitted back-to-back, i.e. there is no transmission delay or interval between the peer MPE-FEC matrices. One way to implement this process is to consider delta-t between peer MPE-FEC matrices as being equal to 0. Another method involves defining a time-slicing burst in such a way that it contains multiple MPE-FEC matrices. In such a system, all priority labeled datagrams that are transmitted in one time-sliced burst will be used as a part of one of the MPE-FEC matrices used in the burst. The structure of such a MPE-FEC matrix is shown in FIG. 2. The number of MPE-FEC matrices used in one time-sliced burst is typically equal to the number of different priority labels of the datagrams that are transmitted in one time-slicing burst. This fact holds true for all time-sliced bursts for a particular service. For example, if there are N priority labeled datagrams that can be transmitted in one time-sliced burst, and there are P different priorities associated with the media IP packets of the service, with each datagram having one and only one of the P priorities, then each of the N datagrams will be used as a part of one of the P MPE-FEC matrices in the burst.

According to one embodiment of the present invention, the peer MPE-FEC matrices are arranged in ascending priority order, i.e. the lowest priority matrix is sent first and the highest priority matrix is sent last. If a receiver starts the reception of the stream in the middle of the period when a certain set of peer MPE-FEC matrices are sent, it is therefore likely that the receiver will receive at least the highest priority MPE-FEC matrix.

According to one aspect of the invention, within one time-sliced burst, the datagrams are grouped using their priority labels. The grouping procedure is performed on all of the datagrams that go into the time-sliced burst. The grouped datagrams are arranged in ascending order such that the datagrams with the lowest priority come first in the transmission order, the media datagrams with the next higher priority come next, etc., until the datagrams group that has the highest priority comes last in the transmission order. This fact holds true for all the time-sliced bursts for a particular service. As an example, there can be N priority labeled datagrams of a service that can be transmitted in one time-sliced burst, with P different priorities associated with these datagrams. If a datagram having one and only one of the P priorities, where $P=\{p_1, p_2, p_3, \ldots p_n\}$ is the set of different priority labels, and if the priority ranking is such that $p_n < p_{n-1} < \ldots < p_2 < p_1$, then all datagrams are grouped in such a way that all datagrams with a priority label of $p_n$ come before all datagrams $p_{n-1}$. This pattern similarly continues until all datagrams with priority $p_1$ come last.

In one embodiment of the present invention, in one time-sliced burst, each grouped set of datagrams ordered according to the criteria mentioned above is used to fill up one of the MPE-FEC matrices in order to compute the RSDT for the MPE-FEC frame. This fact holds true for all time-sliced bursts for a particular service.

In accordance with one embodiment of the present invention, the RSDT for each of the MPE-FEC matrices is computed, with the number of columns of RSDT being a function of the priority labels of the datagrams that constitute the ADT portion of the MPE-FEC matrices. This fact holds true for all time-sliced bursts for a particular service. For example, the RSDT columns for the MPE-FEC matrix that consist of datagrams with priority label $p_n$ will have a lesser number of RSDT columns than the MPE-FEC matrix that consist of datagrams with priority label $p_{n-1}$. In other words, the MPE-FEC matrix that consists of datagrams of priority $p_1$ will have the maximum number of RSDT columns in the time-sliced burst.

In one particular embodiment of the present invention, the choice of RSDT columns for all of the MPE-FEC matrices in the time-sliced bursts in the service is such that the average service bit rate does not overshoot the maximum allowed service bit rate. This can be achieved by choosing the number of RSDT columns of the MPE-FEC matrices optimally in a time-sliced burst, such that the additional byte overhead incurred due to header data and RSDT protection data does not overshoot the maximum constant service bit rate.

According to one embodiment of the present invention, the MPE section headers of all the of sections of the MPE-FEC matrices in the burst, other than the MPE-FEC matrix that contains the datagrams with the highest priority, sets the delta-t value in their section headers to zero, or to a very small value. Similarly, the MPE section headers of all of the sections of the MPE-FEC matrices set the maximum_burst_duration field as the maximum duration of the MPE-FEC matrix reception. The delta-t value in the MPE section headers of MPE-FEC matrix that contain the datagrams with the highest priority is set to the time when the next time-sliced burst for the service starts. This is performed under the assumption that peer MPE-FEC matrices are sent back-to-back and in ascending priority order as discussed above.

Figure 6:
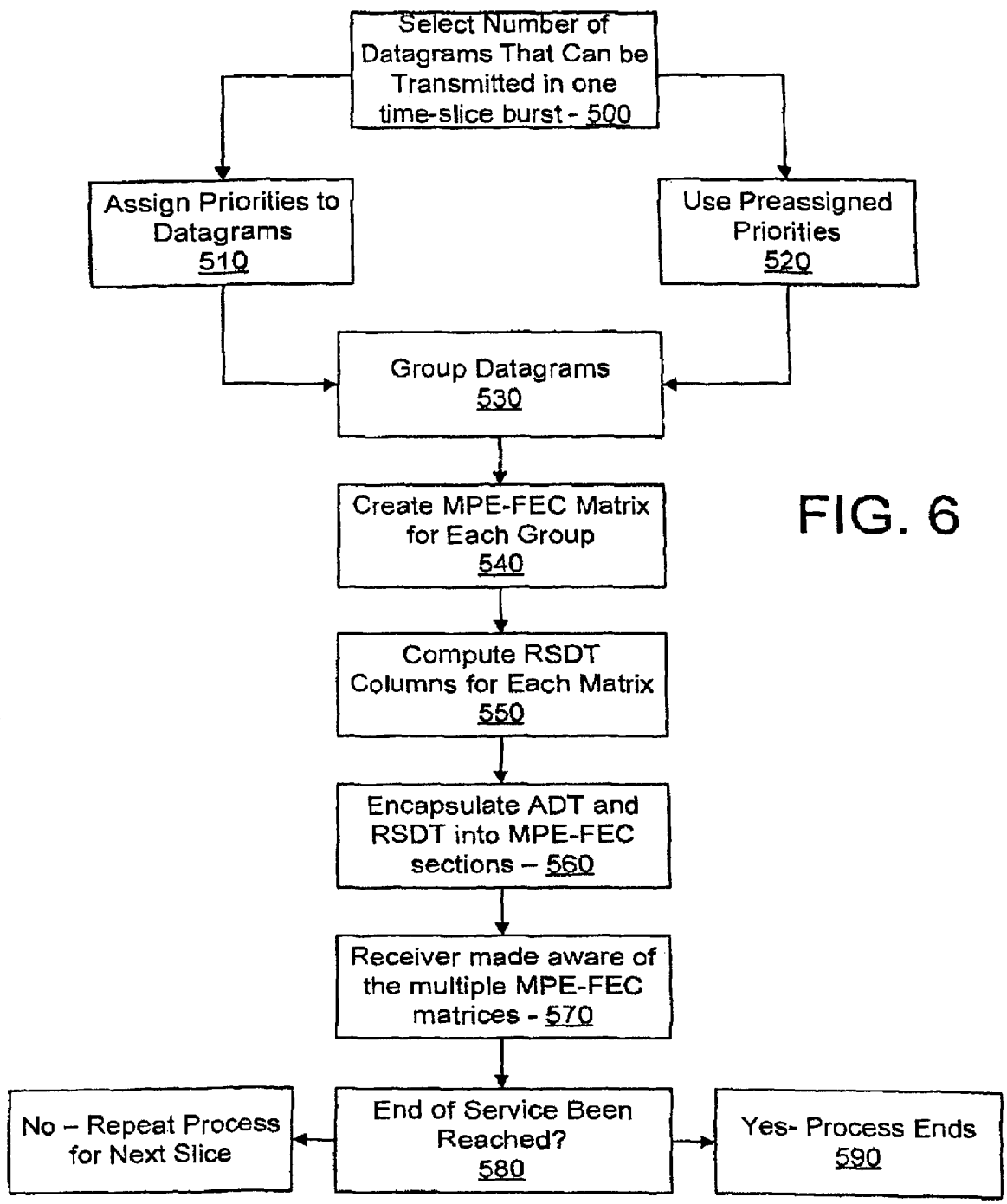
FIG. 6 is a flow chart showing the steps involved in the implementation of one embodiment of the present invention.

FIG. 6 is a flow chart showing the implementation of one embodiment of the present invention. At step 500 in FIG. 6, the number of datagrams of a service that can be transmitted in one time-slice burst is selected. At step 510, priorities are assigned to each of the datagrams. Alternatively, previously assigned priorities, which have been assigned through an external mechanism, can be used. This is represented at step 520. At step 530, the datagrams are grouped based upon the respective priority levels such that high priority datagrams are transmitted last and low priority packets are transmitted earlier.

At step 540 a MPE-FEC matrix is created for each of the groups of packets based upon priority level. At step 550, the RSDT columns are computed for each of the MPE-FEC matrices. The number of RSDT columns for each of the MPE-FEC frame is chosen such that the average service bit rate does not exceed the maximum expected average service bit rate, and the RSDT protection for MPE-FEC matrices with lower priority do not exceed the RSDT protection for MPE-FEC matrices with higher priority. At step 560, the ADT and RSDT of all MPE-FEC matrices in the burst is encapsulated into MPE-FEC sections. Appropriate information, such as MPE headers, is included so that the receiver is aware of the use of multiple MPE-FEC matrices in the time slice burst. Additionally, the settings of the burst size and the delta-t values are also changed as appropriate. The receiver is made aware of the multiple MPE-FEC matrices at step 570 either by an external signaling or by making the appropriate changes in the current standard. At step 580, it is determined whether the end of the service stream has been reached. If the end of the stream has been reached, the process ends at step 590. If there are remaining time-sliced bursts, on the other hand, then the process is repeated until no time-sliced bursts remain.

Figure 4:
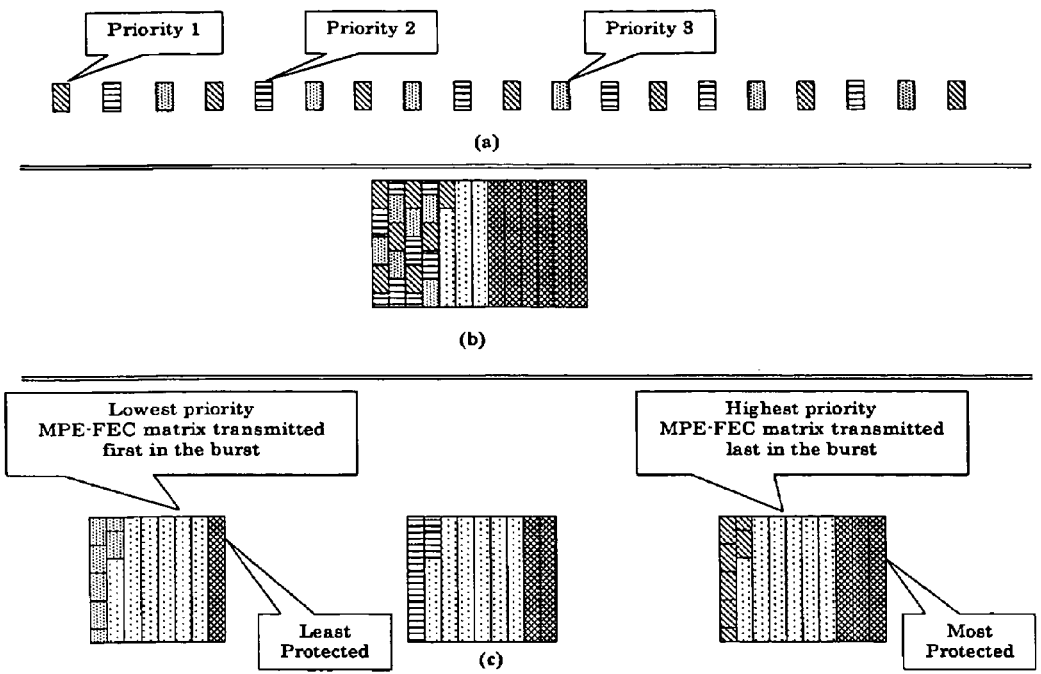
FIG. 4 is a comparison between the creation of MPE-FEC in one time-sliced burst in a conventional system and the creation of MPE-FEC according to the present invention.
Figure 5:
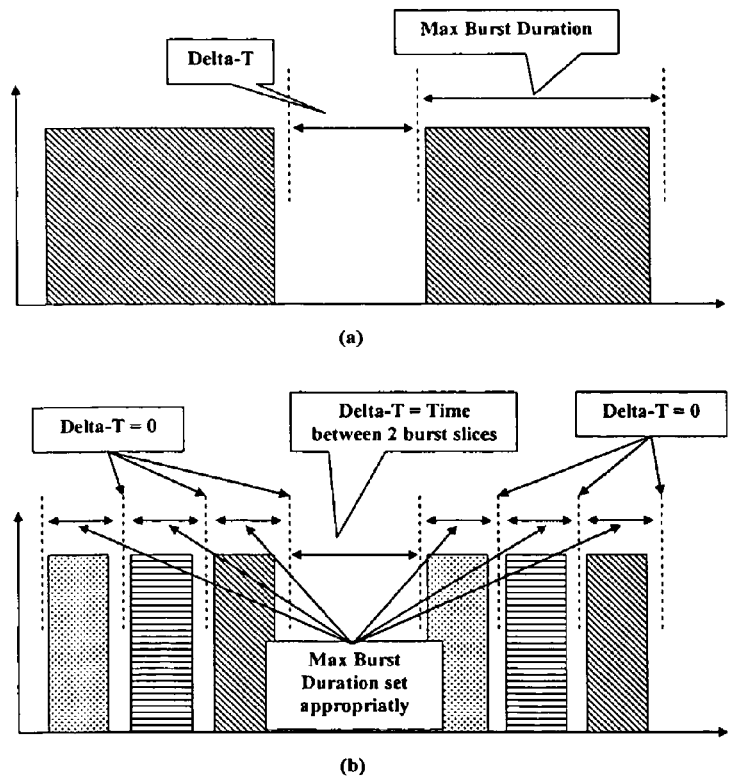
FIG. 5 shows the difference between a conventional system and the present invention in how a time-sliced burst is transported onto a DVB-H channel.

FIG. 4 shows the difference between MPE-FEC creation in one time-sliced burst according to conventional systems and the creation of MPE-FEC according to the present invention. Section (a) shows the sequence of datagrams that can be fit into one time-sliced burst. The pattern coding shows the priorities associated with the datagram. Section (b) shows how the datagrams are used in RSDT computation in conventional systems. Section (c) shows how the invention uses the priority labels to group datagrams of the same priority and the computation of RSDT for the group datagrams based upon the priority labels. FIG. 5 shows a comparison of how a time-sliced burst is transmitted in a conventional system and in a system implementing the present invention.

The present invention is described in the general context of method steps, which may be implemented in one embodiment by a program product including computer-executable instructions, such as program code, executed by computers in networked environments.

Generally, program modules include routines, programs, objects, components, data structures, etc. that perform particular tasks or implement particular abstract data types. Computer-executable instructions, associated data structures, and program modules represent examples of program code for executing steps of the methods disclosed herein. The particular sequence of such executable instructions or associated data structures represent examples of corresponding acts for implementing the functions described in such steps.

Software and web implementations of the present invention could be accomplished with standard programming techniques, with rule based logic, and other logic to accomplish the various database searching steps, correlation steps, comparison steps and decision steps. It should also be noted that the words "component" and "module" as used herein, and in the claims, is intended to encompass implementations using one or more lines of software code, and/or hardware implementations, and/or equipment for receiving manual inputs.

The foregoing description of embodiments of the present invention have been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments and with various modifications as are suited to the particular use contemplated.

What is claimed is:

1. A method for providing unequal error protection to datagrams in a DVB-H transmission system, comprising:
for each time-sliced burst in a media stream processed by a processor:
grouping all datagrams for the time-sliced burst based upon respective priority levels; and
creating a MPE-FEC matrix for each group of datagrams based upon priority level;
computing the number of RSDT columns for each of the MPE-FEC matrices, wherein the number of RSDT columns for each of the MPE-FEC matrices is chosen such that the average service bit rate does not exceed the maximum expected average service bit rate, and the RSDT protection for MPE-FEC matrices with lower priority does not exceed the RSDT protection for MPE-FEC matrices with higher priority; and
encapsulating an application data table and RSDT of all MPE-FEC matrices in the burst into MPE-FEC sections.

2. The method of claim 1, further comprising, for each time-sliced burst, including information in the MPE-FEC sections such that a receiver of the media stream is aware of the use of multiple MPE-FEC matrices in the time-sliced burst.

3. The method of claim 1, wherein the datagrams are grouped such that high priority datagrams are transmitted after low priority datagrams are transmitted.

4. The method of claim 1, further comprising, before grouping datagrams, assigning priority levels to each of the datagrams in the time-sliced burst.

5. The method of claim 1, wherein the priority levels for each of the datagrams are preassigned by an external mechanism.

6. The method of claim 1, further comprising, before performing actions on time-sliced bursts, selecting the number of datagrams of a service that can be transmitted in each one time-slice burst.

7. The method of claim 1, further comprising altering settings of a burst size and the delta-t values as appropriate for the media stream.

8. A non-transitory computer-readable medium including a computer program product executed on a computer device, for providing unequal error protection to IP packets in a DVB-H transmission system, comprising:
for each time-sliced burst in a media stream:
computer code for grouping all datagrams for the time-sliced burst based upon respective priority levels; and
computer code for creating a MPE-FEC matrix for each group of datagrams based upon priority level;
computer code for computing the number of RSDT columns for each of the MPE-FEC matrices, wherein the number of RSDT columns for each of the MPE-FEC matrices is chosen such that the average service bit rate does not exceed the maximum expected average service bit rate, and the RSDT protection for MPE-FEC matrices with lower priority does not exceed the RSDT protection for MPE-FEC matrices with higher priority; and
computer code for encapsulating an application data table and RSDT of all MPE-FEC matrices in the burst into MPE-FEC sections.

9. The non-transitory computer-readable medium of claim 8, further comprising computer code for including information in the MPE-FEC sections such that a receiver of the media stream is aware of the use of multiple MPE-FEC matrices in the time-sliced burst.

10. The non-transitory computer-readable medium of claim 8, wherein the datagrams are grouped such that high priority datagrams are transmitted after low priority packets are transmitted.

11. The non-transitory computer-readable medium of claim 8, further comprising computer code for, before grouping datagrams, assigning priority levels to each of the datagrams in the time-sliced burst.

12. The non-transitory computer-readable medium of claim 8, wherein the priority levels for each of the datagrams are preassigned by an external mechanism.

13. The non-transitory computer-readable medium of claim 8, further comprising computer code for, before performing actions on time-sliced bursts, selecting the number of datagrams of a service that can be transmitted in each one time-slice burst.

14. The non-transitory computer-readable medium of claim 8, further comprising computer code for altering settings of a burst size and the delta-t values as appropriate for the media stream.

15. An electronic device, comprising:
a processor; and
a memory unit operatively connected to the processor and including:
for each time-sliced burst in a media stream:
computer code for grouping all datagrams for the time-sliced burst based upon respective priority levels; and
computer code for creating a MPE-FEC matrix for each group of datagrams based upon priority level;
computer code for computing the number of RSDT columns for each of the MPE-FEC matrices, wherein the number of RSDT columns for each of the MPE-FEC matrices is chosen such that the average service bit rate does not exceed the maximum expected average service bit rate, and the RSDT protection for MPE-FEC matrices with lower priority does not exceed the RSDT protection for MPE-FEC matrices with higher priority; and
computer code for encapsulating an application data table and RSDT of all MPE-FEC matrices in the burst into MPE-FEC sections.

16. The electronic device of claim 15, wherein the memory unit further includes computer code for, for each time-sliced burst, including information in the MPE-FEC sections such that a receiver of the media stream is aware of the use of multiple MPE-FEC matrices in the time-sliced burst.

17. The electronic device of claim 15, wherein the memory unit further includes computer code for, before grouping datagrams, assigning priority levels to each of the datagrams in the time-sliced burst.

18. The electronic device of claim 15, wherein the priority levels for each of the datagrams are preassigned by an external mechanism.

19. The electronic device of claim 15, wherein the memory unit further includes computer code for, before performing actions on time-sliced bursts, selecting the number of datagrams of a service that can be transmitted in each one time-slice burst.

20. The electronic device of claim 15, wherein the memory unit further includes computer code for altering settings of a burst size and the delta-t values as appropriate for the media stream.

21. The electronic device of claim 15, wherein the datagrams are grouped such that high priority datagrams are transmitted after low priority datagrams are transmitted.

* * * * *